United States Patent
Lai et al.

(10) Patent No.: US 11,470,737 B2
(45) Date of Patent: Oct. 11, 2022

(54) CASING ASSEMBLY HAVING A CONFIGURATION FOR BLOCKING EXTRANEOUS MATERIAL

(71) Applicant: GIGA-BYTE TECHNOLOGY CO., LTD., New Taipei (TW)

(72) Inventors: Chih-Ming Lai, New Taipei (TW); Yu Chi Peng, New Taipei (TW)

(73) Assignee: GIGA-BYTE TECHNOLOGY CO., LTD., New Taipei (TW)

(*) Notice: Subject to any disclaimer, the term of this patent is extended or adjusted under 35 U.S.C. 154(b) by 224 days.

(21) Appl. No.: 16/920,233

(22) Filed: Jul. 2, 2020

(65) Prior Publication Data

US 2021/0282286 A1    Sep. 9, 2021

(30) Foreign Application Priority Data

Mar. 9, 2020  (TW) ................. 109107576

(51) Int. Cl.
*H05K 5/06* (2006.01)
*H05K 5/02* (2006.01)
*H05K 5/00* (2006.01)

(52) U.S. Cl.
CPC .......... *H05K 5/063* (2013.01); *H05K 5/0021* (2013.01); *H05K 5/0243* (2013.01); *H05K 5/069* (2013.01)

(58) Field of Classification Search
CPC .... H05K 5/0021; H05K 5/0243; H05K 5/063; H05K 5/069
See application file for complete search history.

(56) References Cited

U.S. PATENT DOCUMENTS 4,711,361 A    12/1987  Mischenko
2008/0028421 A1    1/2008  Kawasaki et al.

FOREIGN PATENT DOCUMENTS

| CN | 107370850 A | * | 11/2017 |
|---|---|---|---|
| DE | 102012213463 A1 | | 2/2014 |
| JP | H0872944 A | | 3/1996 |
| JP | 2006-176191 A | | 7/2006 |

(Continued)

OTHER PUBLICATIONS

TW Office Action in Application No. 109107576 dated Jul. 5, 2021.

(Continued)

*Primary Examiner* — Carl J Arbes
(74) *Attorney, Agent, or Firm* — Maschoff Brennan

(57) ABSTRACT

A casing assembly having at least one configuration for blocking extraneous material and including first shell part and second shell part. First shell part includes contact portion and first recess portion. Second shell part includes step portion and protrusion portion. Step portion is in contact with contact portion of first shell part and forms decorative slot exposed to outside with contact portion. First recess portion is located on side of contact portion that is located away from decorative slot. Protrusion portion is located on side of step portion that is located away from decorative slot and located in first recess portion. Protrusion portion has top surface facing toward first recess portion, first recess portion has bottom surface, and idle cavity is formed between top surface of protrusion portion and bottom surface of first recess portion.

10 Claims, 3 Drawing Sheets

(56) References Cited

FOREIGN PATENT DOCUMENTS

JP  2007-191194 A  8/2007
TW  I672916 B  9/2019

OTHER PUBLICATIONS

JP Office Action in Application No. 2020-172129 dated Oct. 12, 2021.
EP Search Report in Application No. 20208527.0 dated May 10, 2021.

* cited by examiner

CASING ASSEMBLY HAVING A CONFIGURATION FOR BLOCKING EXTRANEOUS MATERIAL

CROSS-REFERENCE TO RELATED APPLICATIONS

This non-provisional application claims priority under 35 U.S.C. § 119(a) on Patent Application No(s). 109107576 filed in Taiwan, R.O.C. on Mar. 9, 2020, the entire contents of which are hereby incorporated by reference.

TECHNICAL FIELD

The disclosure relates to a casing assembly, more particularly to a casing assembly having a configuration for blocking extraneous material.

BACKGROUND

In most cases, due to the manufacturing tolerance and the inherent property of material or the like, the seam between any casings or shells to be assembled together may not be entirely and perfectly sealed. Especially for outer casings or shells whose seam is exposed to the outside, the flaw of the seam may adversely affect the product appearance if it is not eliminated or reduced. To solve this issue, the most common solution is to form a decorative slot (so-called "decorative groove" or "decorative seam") with a suitable size along the seam so as to eliminate or make the adverse visual effect of the seam less obvious, and also, the decorative slot can make the casings look more independent from each other for achieving some particular visual effects.

Meanwhile, in order to prevent extraneous materials (e.g., moisture or dust) from entering into the casings via the decorative slot or the seam, a waterproof or dustproof configuration along the seam is necessary. Conventionally, a common solution is to apply a rubber bar or ring between the casings to be assembled to each other, however, the distance between the casings would be increased due to the rubber bar so that the decorative slot is widened and thereby reducing the appearance attractiveness. Moreover, the installation of the rubber bar not only increases cost and the overall structural complexity but also involves a complex and error-prone process, thereby increasing the overall manufacturing cost and time.

SUMMARY

Accordingly, the disclosure provides a casing assembly having a configuration for blocking extraneous material, which can block extraneous material, such as, external moisture and dust, without using rubber and can obtain an optimal size of the decorative slot.

One embodiment of this disclosure provides a casing assembly having at least one configuration for blocking extraneous material and including a first shell part and a second shell part. The first shell part includes a contact portion and a first recess portion. The second shell part includes a step portion and a protrusion portion. The step portion is in contact with the contact portion of the first shell part and forms a decorative slot exposed to the outside with the contact portion. The first recess portion is located on a side of the contact portion that is located away from the decorative slot. The protrusion portion is located on a side of the step portion that is located away from the decorative slot and located in the first recess portion. The protrusion portion has a top surface facing toward the first recess portion, the first recess portion has a bottom surface, and an idle cavity is formed between the top surface of the protrusion portion and the bottom surface of the first recess portion.

According to the casing assembly having configurations for blocking extraneous material discussed above, the contact portion of the first shell part is in contact with the step portion of the second shell part so that a configuration for blocking extraneous material is formed on the decorative slot to prevent extraneous material (e.g. external moisture or dust) from entering into the casing assembly. Also, there is a protrusion portion protrudes from a side of the step portion of the second shell part that is located away from the decorative slot, and the protrusion portion can be served as another configuration for blocking extraneous material to significantly lengthen the path for the extraneous material to entering into the casing assembly, thereby significantly reducing the possibility for the extraneous material to enter into the casing assembly. Moreover, the idle cavity is formed between the protrusion portion of the second shell part and the first recess portion of the first shell part and the idle cavity is able to hold and store the moisture or dust unexpectedly passing through the said configurations for blocking extraneous material, and thus the idle cavity is served as a third configuration for blocking extraneous material According to the results of the waterproof test and the dustproof test that are defined by IEC/EN60529, the device using the casing assembly having the aforementioned configurations for blocking extraneous material can reach the required or even higher waterproof level and dustproof level. Also, these configurations for blocking extraneous material of the casing assembly do not use any rubber bar or ring, and thus the casing assembly of the disclosure does not involve the issue that the conventional casings have a wide decorative slot due to the existence of rubber ring. Thus, the decorative slot of the casing assembly of the disclosure can be made with a desired small size, achieving a fine and delicate size of decorative slot to improve the appearance attractiveness.

Further, the step portion not only can form the first configuration for blocking extraneous material but also can reduce the depth of the decorative slot so as to further improve the attractiveness of the casing assembly.

As discussed, the casing assembly of the disclosure can reach the required waterproof level and dustproof level without using rubber bar or ring, and can even reach a higher waterproof level and dustproof level than the casing using rubber ring, while having a fine and delicate size of decorative slot. These advantages not only can improve the overall value of the products using the casing assembly of the disclosure but also can reduce the manufacturing cost and structural complexity.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
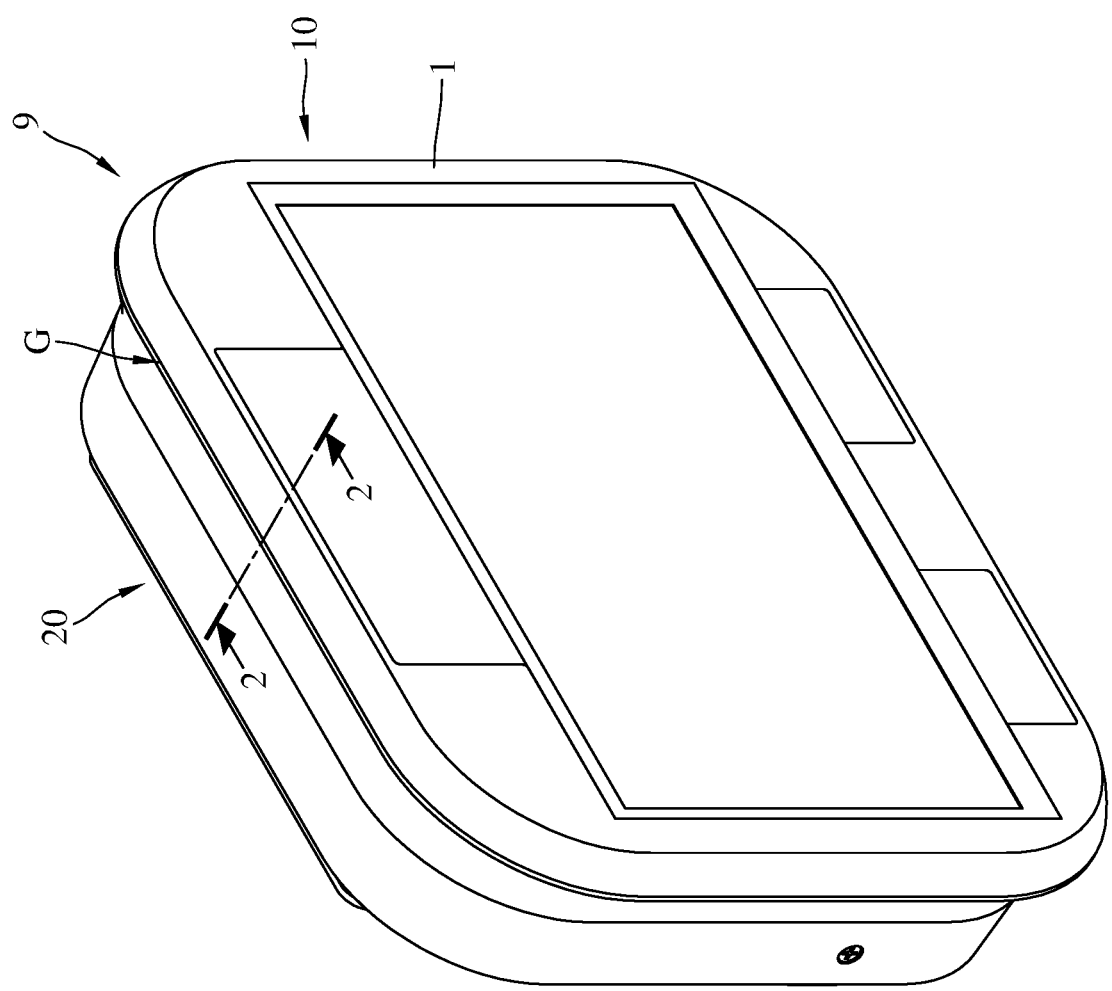
FIG. 1 is a perspective view of a casing assembly having configurations for blocking extraneous material according to an embodiment of the disclosure and of a device including the said casing assembly.

In the following detailed description, for purposes of explanation, numerous specific details are set forth in order to provide a thorough understanding of the disclosed embodiments. It will be apparent, however, that one or more embodiments may be practiced without these specific details.

In addition, for the purpose of simple illustration, well-known features may be drawn schematically, and some unnecessary details may be omitted from the drawings. And the size or ratio of the features in the drawings of the present disclosure may be exaggerated for illustrative purposes, but the present disclosure is not limited thereto. Note that the actual size and designs of the product manufactured based on the teaching of the present disclosure may also be properly modified according to any actual requirement.

Further, as used herein, the terms "end", "part", "portion" or "area" may be used to describe a technical feature on or between component(s), but the technical feature is not limited by these terms. In the following, the term "and/or" may be used to indicate that one or more of the cases it connects may occur. Also, the following paragraphs may use terms, such as "substantially", "approximately" or "about"; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings.

Firstly, please refer to FIG. 1, one embodiment of the disclosure provides a casing assembly 1 having a configuration for blocking extraneous material. The casing assembly 1 may be configured as an outer casing or shell of a device 9. The said device 9 may, but not limited to, be an electronic device including a display (e.g., a face recognition device), but the disclosure is not limited thereto. In some other embodiments, the casing assembly 1 may be configured as an outer casing or shell of other types of electronic devices or mechanical devices that do not involve electronic/electric components.

Figure 2:
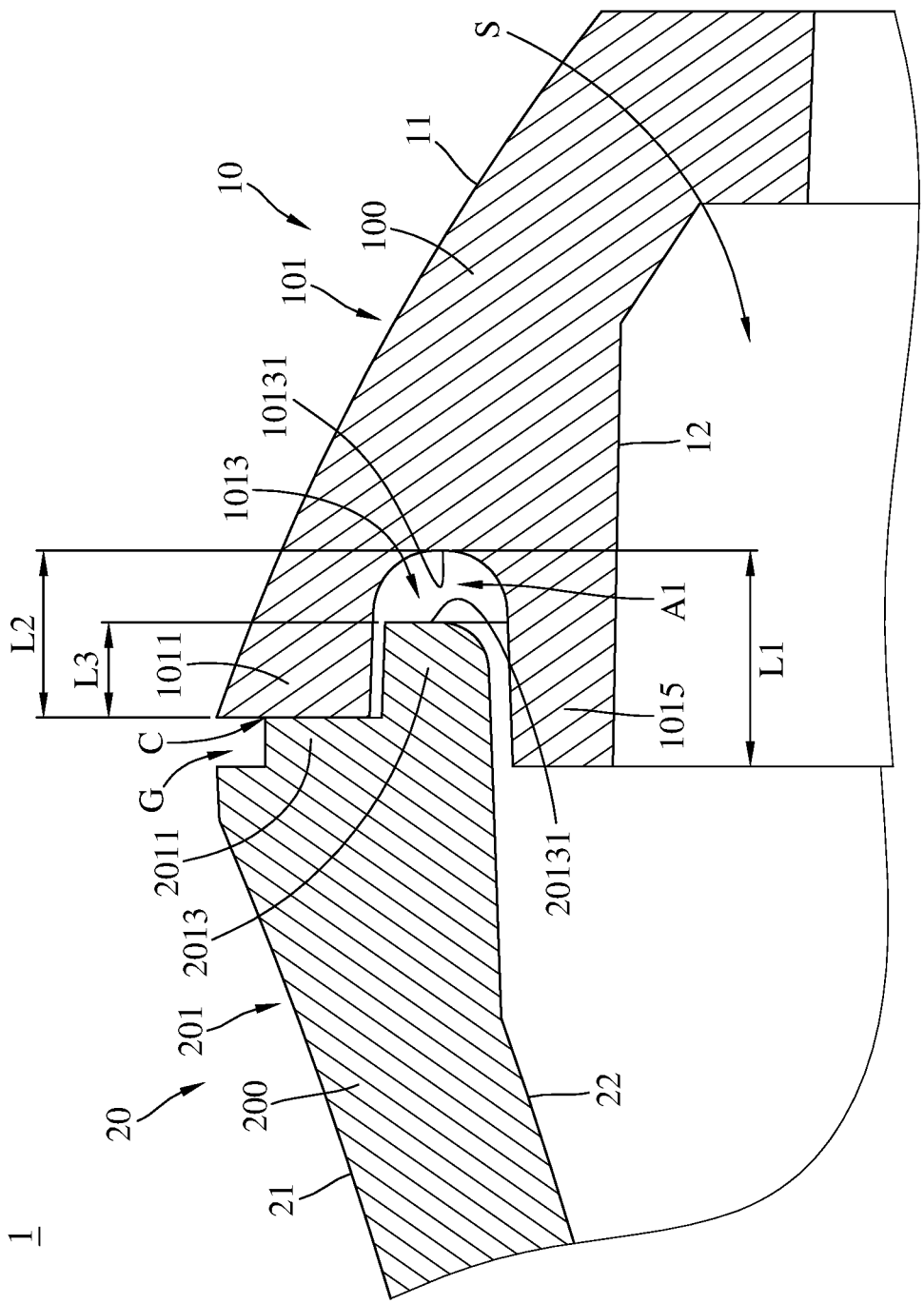
FIG. 2 is a partially enlarged side cross-sectional view of the casing assembly taking along line 2-2 in FIG. 1.

Further, in this embodiment, the casing assembly 1 may at least include a first shell part 10 and a second shell part 20, where the first shell part 10 and the second shell part 20 may be assembled via any suitable manner and the disclosure is not limited thereto. Also, the first shell part 10 and the second shell part 20 may form a decorative slot G (so-called "decorative groove" or "decorative seam") along their seam (e.g., a seam C shown in the following FIG. 2). The functions of the decorative slot G include visually decorating the appearance of the casing assembly 1 or reducing the adverse visual effect of the seam between the first shell part 10 and the second shell part 20 viewing from appearance.

Moreover, the decorative slot G may create a clean edge between the first shell part 10 and the second shell part 20 so as to make them look more independent from each other, achieving a particular visual effect. Note that the decorative slot G shown in FIG. 1 or the later drawings and other associated structures may be exaggerated in size for the purpose of clear illustration, but the disclosure is not limited thereto.

In some cases, the manufacturing tolerance is inevitable, thus the seam between any two casings to be assembled together may not be entirely and perfectly sealed. To eliminate or make the adverse visual effect of the seam less obvious, the most common solution is to form a slot or groove along the seam. In terms of this issue, it is understood that a decorative slot along seam may be necessary to the products that have casings or shells assembly (e.g., the casing assembly 1 of this embodiment). However, the above descriptions do not imply that the seam between the first shell part and the second shell part of the casing assembly of the disclosure must have the aforementioned issue and do not imply that the said issue is caused by the first shell part and the second shell part of the casing assembly of the disclosure.

In this embodiment, the configuration of the casing assembly 1 can feature a relative small-sized decorative slot G and can make the device 9 having the casing assembly 1 reach the required waterproof level and dustproof level. In detail, please refer to FIG. 2, in this embodiment, the first shell part 10 includes a first outer surface 11, a first inner surface 12, a first body portion 100, and a first assemble portion 101. The first outer surface 11 refers to a surface of the first shell part 10 that is exposed to the outside and served as part of the appearance of the casing assembly 1, and that is to say that the first outer surface 11 refers to the part of the first shell part 10 that can be easily and directly seen by a user from the outside of the casing assembly 1. With respect to the first outer surface 11, the first inner surface 12 refers to a surface of the first shell part 10 that is not exposed to the outside or does not served as the appearance of the casing assembly 1, and that is to say that the first inner surface 12 refers to the part of the first shell part 10 that cannot be easily and directly seen by the user from the outside of the casing assembly 1.

The first assemble portion 101 is a part of the first shell part 10 that is configured to be assembled to the second shell part 20 to form the decorative slot G as well as the configuration for blocking the extraneous material, and the first body portion 100 refers to the rest part of the first shell part 10. In this embodiment, the first assemble portion 101 may include a contact portion 1011, a first recess portion 1013, and a first blocking wall 1015, where at least the first recess portion 1013, the first blocking wall 1015, and part of the contact portion 1011 are formed on the first inner surface 12. Note that, in this embodiment, the first shell part 10 may, but not limited to, be integrally formed of a single piece, but the disclosure is not limited thereto.

The second shell part 20 includes a second outer surface 21, a second inner surface 22, a second body portion 200 and a second assemble portion 201. The second outer surface 21 refers to a surface of the second shell part 20 that is exposed to the outside and served as part of appearance of the casing assembly 1, and that is to say that the second outer surface 21 refers to the part of the second shell part 20 that can be easily and directly seen by the user from the outside of the casing assembly 1. With respect to the second outer surface 21, the second inner surface 22 refers to a surface of the second shell part 20 that is not exposed to the outside or dose not served as the appearance of the casing assembly 1, and that is to say that the second inner surface 22 refers to the part of the second shell part 20 that cannot be easily and directly seen by the user from the outside of the casing assembly 1.

The second assemble portion 201 is a part of the second shell part 20 that is configured to be assembled to the first assemble portion 101 of the first shell part 10 to form the decorative slot G as well as the configuration for blocking the extraneous material, and the second body portion 200 refers to the rest part of the second shell part 20. In this embodiment, the second assemble portion 201 may include a step portion 2011 and a protrusion portion 2013, where at least the protrusion portion 2013 and a part of the step portion 2011 are formed on the second inner surface 22. Noted that, in this embodiment, the second shell part 20 may, but not limited to, be integrally formed of a single piece, but the disclosure is not limited thereto.

In addition, as shown, the first inner surface 12 of the first shell part 10 and the second inner surface 22 of the second shell part 20 may together form an inner space S therebetween. The inner space S may be configured to accommodate any required mechanism or electronic/electric components or devices (not shown and the disclosure is not limited thereto) for the device 9.

Next, the connection between the first assemble portion 101 of the first shell part 10 and the second assemble portion 201 of the second shell part 20 is illustrated in detail hereinafter. Further, in this embodiment, the contact portion 1011 of the first assemble portion 101 and the first blocking wall 1015 extends towards the second assemble portion 201 from the first body portion 100. The first recess portion 1013 is formed between the contact portion 1011 and the first blocking wall 1015; in other words, the contact portion 1011 and the first blocking wall 1015 are respectively formed on two opposite sides of the first recess portion 1013. Specifically, the contact portion 1011 is located on a side of the first recess portion 1013 that is located closer to the first outer surface 11 or the decorative slot G, and the first blocking wall 1015 extends from another side of the first recess portion 1013 that is located away from the first outer surface 11 or the decorative slot G and is located on a side of the protrusion portion 2013 that is located away from the decorative slot G.

In this embodiment, two opposite sides of the first recess portion 1013 are different in depth. Specifically, a protruding length L1 of the first blocking wall 1015 from the bottom surface 10131 of the first recess portion 1013 is greater than a protruding length L2 of the contact portion 1011 from the bottom surface 10131 of the first recess portion 1013. That is, the depth of the side of the first recess portion 1013 that is located away from the first outer surface 11 or the decorative slot G is greater than that of another side of the first recess portion 1013 that is located closer to the first outer surface 11 or the decorative slot G.

On the other hand, the step portion 2011 of the second assemble portion 201 and the protrusion portion 2013 extend towards the first assemble portion 101 of the first shell part 10 from the second body portion 200, and the step portion 2011 is located closer to the second outer surface 21 or the decorative slot G than the protrusion portion 2013. Furthermore, a protruding length L3 of the protrusion portion 2013 from the step portion 2011 is smaller than the aforementioned protruding length L1 of the first blocking wall 1015 and the protruding length L2 of the contact portion 1011. That is, the protruding length L3 of the protrusion portion 2013 from the step portion 2011 is smaller than the depth of any side of the first recess portion 1013.

In this embodiment, a part of the first inner surface 12 of the first shell part 10 located on the contact portion 1011 and a part of the second inner surface 22 of the second shell part 20 located on the step portion 2011 may be in direct contact with each other in, for example, a plane-to-plane manner. Accordingly, a surface of the contact portion 1011 and a surface of the step portion 2011 may form a seam C between the first shell part 10 and the second shell part 20 and form the decorative slot G exposed to the outside and extending along the seam C. Herein, the tight contact between the contact portion 1011 and the step portion 2011 form a first configuration for blocking extraneous material at the decorative slot G, preventing extraneous material (e.g., external moisture or dust) from entering into the casing assembly 1.

In addition, the protrusion portion 2013 of the second shell part 20 is substantially perpendicular to the step portion 2011, and further, a part of the second inner surface 22 facing toward a side of the decorative slot G on the protrusion portion 2013 is substantially perpendicular to a part of the second inner surface 22 facing toward the first shell part 10 on the step portion 2011. That is, a surface of the protrusion portion 2013 facing toward a side of the decorative slot G is substantially perpendicular to a surface of the step portion 2011 in contact with the contact portion 1011 of the first shell part 10. Thus, the protrusion portion 2013 of the second shell part 20 forms a second configuration for blocking extraneous material, preventing extraneous material from entering into the inner space S of the casing assembly 1.

Moreover, the protrusion portion 2013 of the second shell part 20 is located in the first recess portion 1013 of the first shell part 10, and since the protruding length L3 of the protrusion portion 2013 from the step portion 2011 is smaller than the depth of any side of the first recess portion 1013, the protrusion portion 2013 located in the first recess portion 1013 does not contact the bottom part of the first recess portion 1013. With such an arrangement, a part of the second inner surface 22 located on the protrusion portion 2013 and a part of the first inner surface 12 located on the first recess portion 1013 together form an idle cavity A1. More specifically, a part of the first inner surface 12 located on the bottom part of the first recess portion 1013 is referred to as a bottom surface 10131, a part of the second inner surface 22 facing toward the bottom surface 10131 on the protrusion portion 2013 is referred to as a top surface 20131, and the top surface 20131 of the protrusion portion 2013 and the bottom surface 10131 of the first recess portion 1013 are spaced apart from each other and from the idle cavity A1 therebetween. The idle cavity A1 may at least be configured to store a certain amount of extraneous material such as liquid or dust, thus the idle cavity A1 is able to hold and store the extraneous material unexpectedly passing through the second configuration. As such, the idle cavity A1 can be served as a third configuration for blocking extraneous material. Also, the alternate arrangement of the first blocking wall 1015 and the protrusion portion 2013 increases the path from the idle cavity A1 to the inner space S, such that the possibility for the extraneous material to enter into the inner space S from the idle cavity A1 can be significantly reduced.

As discussed above, the cooperation of the first assemble portion 101 of the first shell part 10 and the second assemble portion 201 of the second shell part 20 can at least form three configurations for preventing extraneous material from entering into the casing assembly 1. Based on the result of a waterproof test and a dustproof test taken on the device 9 having the casing assembly 1, the said configurations of the casing assembly 1 can make the device 9 reach or even exceed the required waterproof level and dustproof level.

In detail, a waterproof test according to IEC/EN60529 (IPX) is performed on a face recognition device having the casing assembly 1 of the previous embodiment, where the waterproof test is performed under an environmental temperature of 25° C.±10° C. and relative humidity (RH) of 50%±25% while the device 9 is not in operation, and the test is performed on all the surfaces (including front surface, rear surface, top surface and so on) of the casing assembly 1 using 16 spray nozzles that each provide a water volume of about 0.7 liter/minute and spraying angle of ±60° for 5 minutes. As a result, no liquid exists in the interior of the casing assembly 1, and the device 9 is still functional.

On the other hand, a solid particle protection test according to IEC/EN60529 (IP5X) is performed on the same device under the same environmental conditions, during the test, the device is not in operation, and the test is performed on all the surfaces of the casing assembly 1 using a total of 2 kg talcum particles (powder) in 100% dry and density of 2.03 g/cm$^3$ for 8 hours, where the ratio of the amount of particles whose diameter is smaller than 5 micrometers to the total amount of the particles is 33.1%±5, the ratio of the amount of particles whose diameter ranges between 5 and 10 micrometers to the total amount of the particles is 36.97%±5, the ratio of the amount of particles whose diameter ranges between 10 and 20 micrometers to the total amount of the particles is 25%±5, the ratio of the amount of particles whose diameter ranges between 20 and 44 micrometers to the total amount of the particles is 4.92%±5. As a result, no talcum particles exist in the interior of the casing assembly 1, and the device 9 is still functional.

Accordingly, the aforementioned configurations of the casing assembly 1 can feature waterproof and dustproof functions and can make the device 9 having the same reach the required waterproof level and dustproof level defined by IEC/EN60529. Even, the test results already prove that the first configuration formed by the contact portion 1011 and the step portion 2011 along the decorative slot G is sufficient and effective to block the moisture and particles, it is understood that the casing assembly 1, that has the second configuration formed by the protrusion portion 2013 and the third configuration formed by the idle cavity A1, can actually make the device 9 achieve a higher waterproof level and dustproof level.

Also, there is no rubber bar or ring used in these configurations for blocking extraneous material of the casing assembly 1. For example, there is no rubber existing on the first recess portion 1013 or between any surfaces that are in contact with each other, and thus the casing assembly 1 does not involve the problem that the conventional casings have a wide decorative slot due to the existence of rubber ring. That is, the decorative slot G of the casing assembly 1 can be made with a desired small size, achieving a fine and delicate size of decorative slot to improve the attractiveness of the casing assembly 1. In addition, the step portion 2011 not only can form the first configuration for blocking extraneous material, but also can reduce the depth of the decorative slot G so as to further enhance the attractiveness of the casing assembly 1.

As discussed, the casing assembly of the disclosure can reach the required waterproof level and dustproof level without using rubber bar or ring, and can even reach a higher waterproof level and dustproof level than the casing using rubber ring, while having a fine and delicate size of decorative slot. These advantages not only can improve the overall value of the products using the casing assembly of the disclosure but also can reduce the manufacturing cost and structural complexity.

Figure 3:
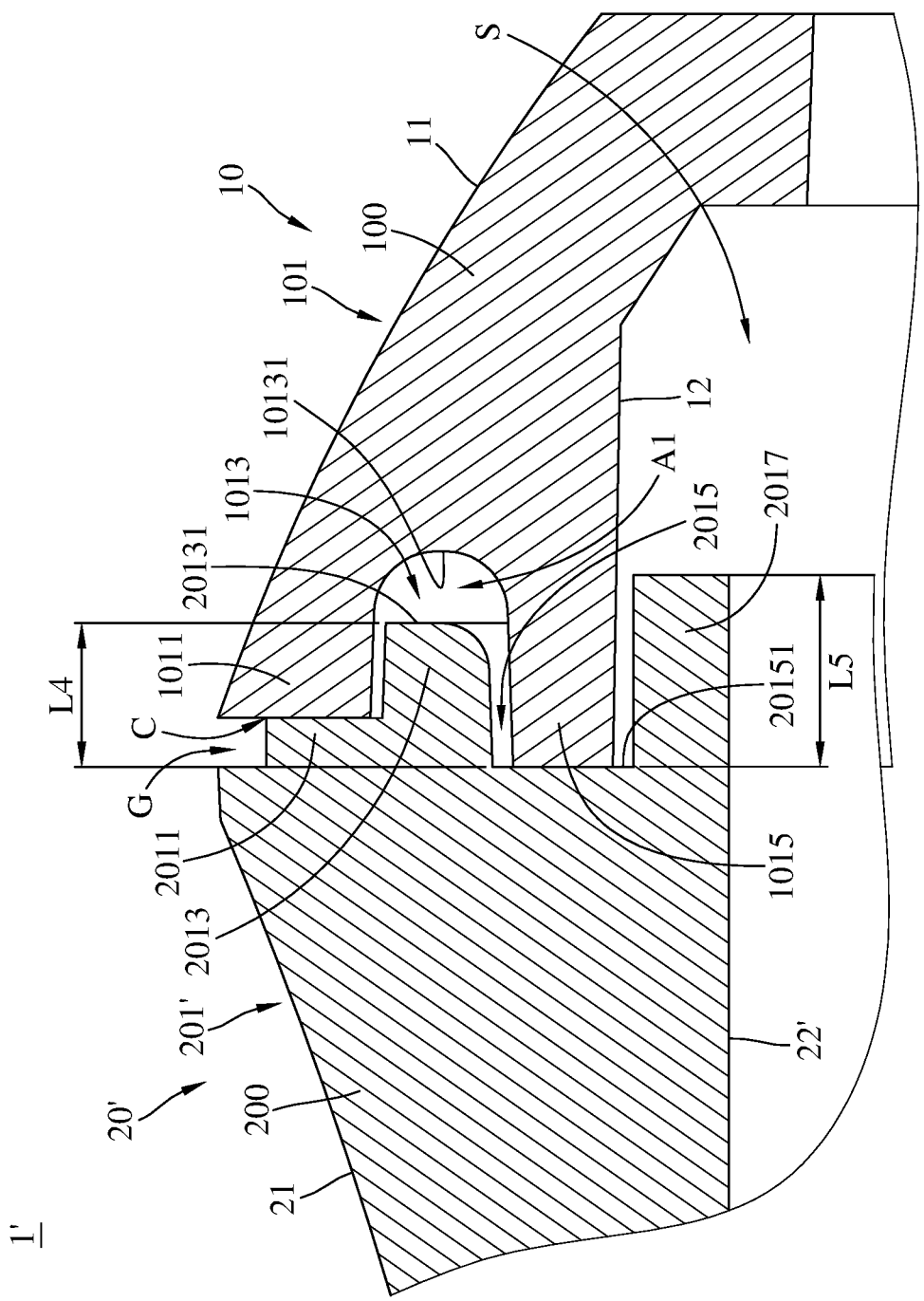
FIG. 3 is a partially enlarged side cross-sectional view of a casing assembly having configurations for blocking extraneous material according to another embodiment of the disclosure.

However, the disclosure is not limited by the casing assembly of the aforementioned embodiments. For example, please refer to FIG. 3, a partially enlarged side cross-sectional view of a casing assembly 1' having configurations for blocking extraneous material according to another embodiment of the disclosure is provided. Note that the main differences between the casing assembly 1' in FIG. 3 and the casing assembly 1 is the configuration of the second assemble portion of the second shell part, thus the following descriptions mainly focus on their differences, where the same reference numbers are denoted to the similar or same components, and the similar or same parts can be comprehended with the reference to the above descriptions, and thus the repeated descriptions are therefore omitted.

As shown in the drawings, in this embodiment, the second assemble portion 201' of the second shell part 20' of the casing assembly 1' further includes a second blocking wall 2017 and a second recess portion 2015 formed on the second inner surface 22'. Specifically, the second blocking wall 2017 extends towards the first assemble portion 101 of the first shell part 10 from the second body portion 200, and the second recess portion 2015 is formed between the protrusion portion 2013 and the second blocking wall 2017. In other words, the protrusion portion 2013 and the second blocking wall 2017 are respectively formed on two opposite sides of the second recess portion 2015, where the protrusion portion 2013 is located on a side of the second recess portion 2015 that is located closer to the second outer surface 21 or the decorative slot G, and the second blocking wall 2017 is located on another side of the second recess portion 2015 that is located away from the second outer surface 21 or the decorative slot G.

In this embodiment, two opposite sides of the second recess portion 2015 are different in depth. Specifically, a protruding length L4 of the protrusion portion 2013 from the blocking surface 20151 of the second recess portion 2015 is smaller than a protruding length L5 of the second blocking wall 2017 from the blocking surface 20151 of the second recess portion 2015. That is to say, the depth of the side of the second recess portion 2015 that is located away from the second outer surface 21 or the decorative slot G is greater than that of another side of the second recess portion 2015 that is located closer to the second outer surface 21 or the decorative slot G.

In this embodiment, the first blocking wall 1015 of the first shell part 10 is located in the second recess portion 2015, and a part of the first inner surface 12 that is located on the first blocking wall 1015 may be in contact with a part of the second inner surface 22' that is located on the second recess portion 2015 (i.e., the blocking surface 20151 of the second recess portion 2015), so as to form a fourth configuration for blocking extraneous material, preventing extraneous material from entering into the inner space S of the casing assembly 1'.

In addition, a part of the second inner surface 22' facing toward a side of the decorative slot G on the second blocking wall 2017 is substantially perpendicular to a part of the bottom part of the second inner surface 22' that is located on the second recess portion 2015 (i.e., the blocking surface 20151 of the second recess portion 2015), and thus the second blocking wall 2017 of the second shell part 20' can form a fifth configuration for blocking extraneous material so as to prevent extraneous material from entering into the inner space S of the casing assembly 1'. Also, the alternate arrangement of the second blocking wall 2017 of the second shell part 20' and the first blocking wall 1015 of the first shell part 10 increases the path from the second recess portion 2015 to the inner space S, thereby significantly reducing the possibility for the extraneous material to enter into the inner space S from the second recess portion 2015.

As discussed above, the casing assembly 1' provided by this embodiment additionally form two configurations for blocking extraneous material, and thus it can be understood that the casing assembly 1' can reach higher waterproof level and dustproof level. Surely, according to actual requirements, the casing assembly can further form more configurations for blocking extraneous material based on the teaching of the above embodiments.

According to the casing assembly having configurations for blocking extraneous material discussed above, the contact portion of the first shell part is in contact with the step portion of the second shell part so that a configuration for blocking extraneous material is formed on the decorative slot to prevent extraneous material (e.g. external moisture or dust) from entering into the casing assembly. Also, there is a protrusion portion protrudes from a side of the step portion of the second shell part that is located away from the decorative slot, and the protrusion portion can be served as another configuration for blocking extraneous material to significantly lengthen the path for the extraneous material to entering into the casing assembly, thereby significantly reducing the possibility for the extraneous material to enter into the casing assembly. Moreover, the idle cavity is formed between the protrusion portion of the second shell part and the first recess portion of the first shell part and the idle cavity is able to hold and store the moisture or dust unexpectedly passing through the said configurations for blocking extraneous material, and thus the idle cavity is served as a third configuration for blocking extraneous material.

According to the results of the waterproof test and the dustproof test that are defined by IEC/EN60529, the device using the casing assembly having the aforementioned configurations for blocking extraneous material can reach the required or even higher waterproof level and dustproof level. Also, these configurations for blocking extraneous material of the casing assembly do not use any rubber bar or ring, and thus the casing assembly of the disclosure does not involve the issue that the conventional casings have a wide decorative slot due to the existence of rubber ring. Thus, the decorative slot of the casing assembly of the disclosure can be made with a desired small size, achieving a fine and delicate size of decorative slot to improve the appearance attractiveness.

Further, the step portion not only can form the first configuration for blocking extraneous material but also can reduce the depth of the decorative slot so as to further improve the attractiveness of the casing assembly.

As discussed, the casing assembly of the disclosure can reach the required waterproof level and dustproof level without using rubber bar or ring, and can even reach a higher waterproof level and dustproof level than the casing using rubber ring, while having a fine and delicate size of decorative slot. These advantages not only can improve the overall value of the products using the casing assembly of the disclosure but also can reduce the manufacturing cost and structural complexity.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A casing assembly having at least one configuration for blocking extraneous material, the casing assembly comprising:
   a first shell part, comprising a contact portion and a first recess portion; and
   a second shell part, comprising a step portion and a protrusion portion, the step portion being in contact with the contact portion of the first shell part and forming a decorative slot exposed to the outside with the contact portion, the first recess portion located on a side of the contact portion that is located away from the decorative slot, the protrusion portion integrally formed with the step portion and located on a side of the step portion that is located away from the decorative slot and located in the first recess portion;
   wherein, the protrusion portion has a top surface facing toward the first recess portion, the first recess portion has a bottom surface, the protrusion portion protrudes towards the bottom surface of the first recess portion and an idle cavity is formed between the top surface of the protrusion portion and the bottom surface of the first recess portion.

2. The casing assembly according to claim 1, wherein a surface of the protrusion portion facing toward a side of the decorative slot is substantially perpendicular to a surface of the step portion in contact with the contact portion.

3. The casing assembly according to claim 1, wherein the first shell part further comprises a first blocking wall, the first blocking wall extends from a side of the first recess portion that is located away from the decorative slot and is located on a side of the protrusion portion that is located away from the decorative slot.

4. The casing assembly according to claim 3, wherein a protruding length of the first blocking wall from the bottom surface of the first recess portion is greater than a protruding length of the contact portion from the bottom surface of the first recess portion.

5. The casing assembly according to claim 3, wherein the second shell part further comprises a second recess portion and a second blocking wall, the second recess portion is located on a side of the protrusion portion that is located away from the decorative slot, the first blocking wall is located in the second recess portion, and the second blocking wall is located on a side of the second recess portion that is located away from the decorative slot.

6. The casing assembly according to claim 5, wherein the first blocking wall is in contact with a blocking surface of the second recess portion.

7. The casing assembly according to claim 5, wherein a protruding length of the protrusion portion to a blocking surface of the second recess portion is smaller than a protruding length of the second blocking wall to the blocking surface of the second recess portion.

8. The casing assembly according to claim 5, wherein a surface of the second blocking wall that faces toward a side of the decorative slot is substantially perpendicular to a blocking surface of the second recess portion.

9. The casing assembly according to claim 5, wherein the first blocking wall is located between the protrusion portion and the second blocking wall.

10. The casing assembly according to claim 1, wherein there is no rubber existing in the first recess portion.

\* \* \* \* \*